(12) United States Patent
Fu et al.

(10) Patent No.: US 9,024,393 B2
(45) Date of Patent: May 5, 2015

(54) MANUFACTURING METHOD FOR SEMICONDUCTOR DEVICE HAVING METAL GATE

(71) Applicant: United Microelectronics Corp., Hsin-Chu (TW)

(72) Inventors: Ssu-I Fu, Kaohsiung (TW); Wen-Tai Chiang, Tainan (TW); Ying-Tsung Chen, Kaohsiung (TW); Shih-Hung Tsai, Tainan (TW); Chien-Ting Lin, Hsinchu (TW); Chi-Mao Hsu, Tainan (TW); Chin-Fu Lin, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 220 days.

(21) Appl. No.: 14/140,546

(22) Filed: Dec. 26, 2013

(65) Prior Publication Data

US 2014/0106557 A1   Apr. 17, 2014

Related U.S. Application Data

(62) Division of application No. 13/326,342, filed on Dec. 15, 2011, now Pat. No. 8,669,618.

(51) Int. Cl.
| | |
|---|---|
| *H01L 21/02* | (2006.01) |
| *H01L 21/28* | (2006.01) |
| *H01L 21/8238* | (2006.01) |
| *H01L 29/49* | (2006.01) |
| *H01L 29/66* | (2006.01) |
| *H01L 29/51* | (2006.01) |
| *H01L 29/78* | (2006.01) |

(52) U.S. Cl.
CPC .. *H01L 21/28114* (2013.01); *H01L 21/823842* (2013.01); *H01L 21/28088* (2013.01); *H01L 29/4966* (2013.01); *H01L 29/517* (2013.01); *H01L 29/66545* (2013.01); *H01L 29/6659* (2013.01); *H01L 29/7833* (2013.01); *H01L 21/823828* (2013.01)

(58) Field of Classification Search
USPC .................................. 257/330, 368
See application file for complete search history.

(56) References Cited

U.S. PATENT DOCUMENTS

| | | | |
|---|---|---|---|
| 6,784,472 B2 | 8/2004 | Iriyama et al. | |
| 7,126,199 B2 | 10/2006 | Doczy | |
| 7,381,608 B2 | 6/2008 | Brask | |
| 7,470,973 B2 | 12/2008 | Takao | |
| 7,871,915 B2 | 1/2011 | Lim | |
| 8,232,607 B2 | 7/2012 | Edge | |

(Continued)

*Primary Examiner* — Mohammad Islam
*Assistant Examiner* — Ankush Singal
(74) *Attorney, Agent, or Firm* — Winston Hsu; Scott Margo

(57) ABSTRACT

A manufacturing method for semiconductor device having metal gate includes providing a substrate having a first semiconductor device and a second semiconductor device formed thereon, the first semiconductor device having a first gate trench and the second semiconductor device having a second gate trench; sequentially forming a high dielectric constant (high-k) gate dielectric layer and a multiple metal layer on the substrate; forming a first work function metal layer in the first gate trench; performing a first pull back step to remove a portion of the first work function metal layer from the first gate trench; forming a second work function metal layer in the first gate trench and the second gate trench; and performing a second pull back step to remove a portion of the second work function metal layer from the first gate trench and the second gate trench.

20 Claims, 7 Drawing Sheets

(56) References Cited

U.S. PATENT DOCUMENTS

| | | |
|---|---|---|
| 8,310,012 B2 | 11/2012 | Hwang |
| 8,324,118 B2 | 12/2012 | Liu |
| 8,426,300 B2 | 4/2013 | Ramachandran |
| 8,513,740 B2 | 8/2013 | Park |
| 2006/0278934 A1 | 12/2006 | Nagahama |
| 2007/0262451 A1 | 11/2007 | Rachmady et al. |
| 2010/0081262 A1 | 4/2010 | Lim |
| 2011/0121399 A1 | 5/2011 | Park |
| 2011/0156154 A1 | 6/2011 | Hoentschel |
| 2011/0248359 A1 | 10/2011 | Hwang |
| 2012/0139061 A1 | 6/2012 | Ramachandran |
| 2013/0045594 A1 | 2/2013 | Wang |
| 2013/0099307 A1* | 4/2013 | Tseng et al. ............... 257/330 |
| 2013/0187236 A1 | 7/2013 | Xie |

* cited by examiner

MANUFACTURING METHOD FOR SEMICONDUCTOR DEVICE HAVING METAL GATE

CROSS REFERENCE TO RELATED APPLICATIONS

This application is a division of U.S. application Ser. No. 13/326,342 filed on Dec. 15, 2011, and all benefits of such earlier application are hereby claimed for this division application.

BACKGROUND OF THE INVENTION

1. Field of the Invention

The invention relates to a manufacturing method for semiconductor device having metal gate, and more particularly, to a manufacturing method for semiconductor device having metal gate integrated with the gate last process and the high-k last process.

2. Description of the Prior Art

With a trend toward scaling down the size of the semiconductor device, work function metals are used to replace the conventional polysilicon gate to be the control electrode that competent to the high dielectric constant (hereinafter abbreviated as high-K) gate dielectric layer. The conventional dual metal gate methods are categorized into the gate first process and the gate last process. Among the two main processes, the gate last process is able to avoid processes of high thermal budget and to provide wider material choices for the high-K gate dielectric layer and the metal gate, and thus gradually replaces the gate first process.

In the conventional gate last process, a dummy gate or a replacement gate is formed on a substrate and followed by steps of forming a conventional metal-oxide semiconductor (MOS) transistor device. Subsequently, the dummy/replacement gate is removed to form a gate trench. Then the gate trench is filled with work function metals required by different conductivity types. However, each layer formed in the gate trenches reduces an opening width of the gate trench by forming overhangs. The overhang problem makes it difficult to fill the gate trench with the other material. Serious overhang problem even results in a seam in the gate trench and makes the filling metal layer cannot be formed in the gate trench as desired. Eventually, the electrical performance of the transistor device having the metal gate is deteriorated.

Accordingly, though the gate last process is able to avoid processes of high thermal budget and to provide more material choices for the high-K gate dielectric layer and the metal gate, the gate last process still faces integrity requirements for the complicated processes and reliability requirement for the layers filling in the gate trench.

SUMMARY OF THE INVENTION

According to an aspect of the present invention, a manufacturing method for semiconductor device having metal gate is provided. The manufacturing method includes providing a substrate having a first semiconductor device and a second semiconductor device formed thereon, the first semiconductor device having a first gate trench and the second semiconductor device having a second gate trench; sequentially forming a high-k gate dielectric layer and a multiple metal layer on the substrate; forming a first work function metal layer in the first gate trench while the multiple metal layer being exposed in the second gate trench; performing a first pull back step to remove a portion of the first work function metal layer from the first gate trench; forming a second work function metal layer in the first gate trench and the second gate trench; and performing a second pull back step to remove a portion of the second work function metal layer from the first gate trench and the second gate trench.

According to the manufacturing method for semiconductor device having metal gate provided by the present invention, the first pull back step is performed to remove portions of the first work function metal layer from the first gate trench, preferably from both of the first gate trench and the second gate trench, after forming the first work function metal layer in the first gate trench. Consequently, a wider opening of the first gate trench is at least obtained. And thus trench-filling results of the following formed layers, such as the second work function metal layer, are improved. In the same concept, the second pull back step is performed to remove the portions of the second work function metal layer from the first gate trench and the second gate trench after forming the second work function metal layer. Accordingly, the first work function metal layer and the second work function metal layer obtain a U shape. More important, topmost portions of the U-shaped first work function metal layer and the U-shaped second work function metal layer are all lower than the openings of the gate trenches. Thus the subsequently formed material, such as the filling metal layer, is successfully formed in all gate trenches and seams are avoided. Accordingly, the manufacturing method for semiconductor device having metal gate provided by the present invention avoids the seam and the adverse impact rendered from the seams, and thus has the advantage of improved reliability.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a manufacturing method for semiconductor device having metal gate provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing illustrating a modification to the preferred embodiment, and FIG. 7 is a schematic drawing in a step subsequent to FIG. 5.

FIGS. 8-13 are schematic drawings illustrating a manufacturing method for semiconductor device having metal gate provided by a second preferred embodiment of the present invention, wherein FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12.

DETAILED DESCRIPTION

Figure 1:
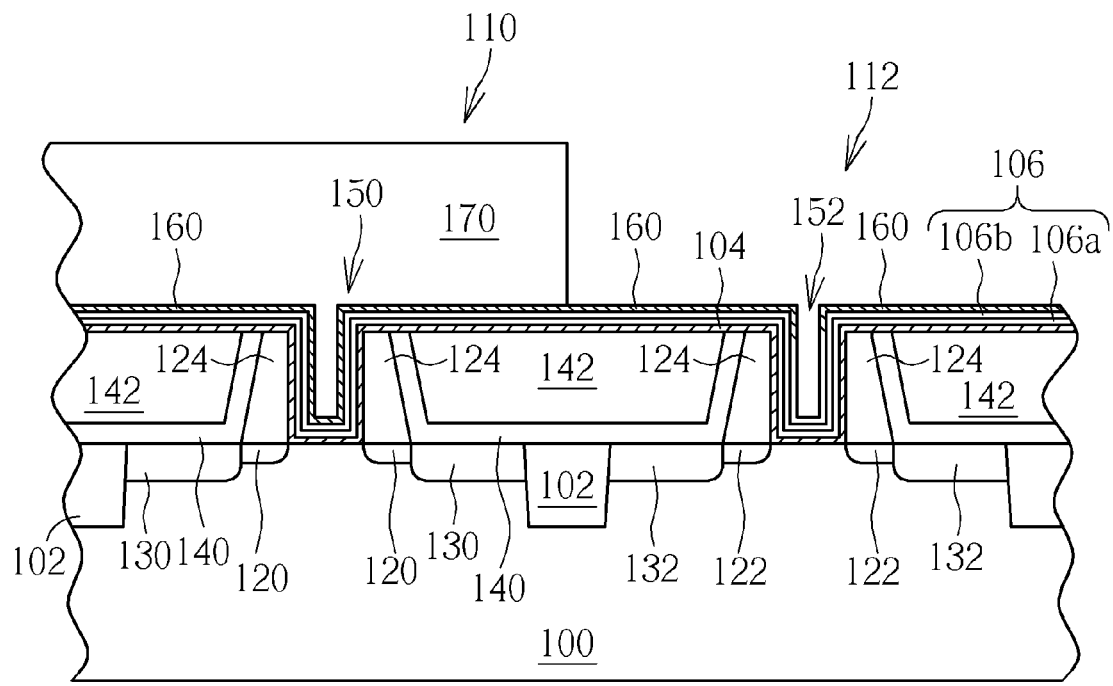

Please refer to FIGS. 1-7, which are drawings illustrating a manufacturing method for semiconductor device having metal gate provided by a first preferred embodiment of the present invention. As shown in FIG. 1, the preferred embodiment first provides a substrate 100 such as silicon substrate, silicon-containing substrate, or silicon-on-insulator (SOI) substrate. The substrate 100 includes a first semiconductor device 110 and a second semiconductor device 112 formed thereon. A shallow trench isolation (STI) 102 is formed in the substrate 100 between the first semiconductor device 110 and the second semiconductor device 112 for providing electrical isolation. The first semiconductor device 110 includes a first conductivity type, the second semiconductor device 112 includes a second conductivity type, and the first conductivity type and the second conductivity type are complementary. In the preferred embodiment, the first conductivity type is p-type and the second conductivity type is n-type.

Please refer to FIG. 1. The first semiconductor device 110 and the second semiconductor device 112 respectively includes a dielectric layer (not shown) and a dummy gate (not shown). The dielectric layer can be a conventional silicon oxide ($SiO_2$) layer and the dummy gate can include a polysilicon layer. Furthermore, the first semiconductor device 110 and the second semiconductor device 112 respectively include first lightly doped drains (LDDs) 120 and second LDDs 122, a spacer 124, a first source/drain 130 and a second source/drain 132. Additionally, salicides (not shown) are respectively formed on the first source/drain 130 and the second source/drain 132. After forming the first semiconductor device 110 and the second semiconductor device 112, a contact etch stop layer (CESL) 140 and an inter-layer dielectric (ILD) layer 142 are sequentially formed. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the first source/drain 130 and the second source/drain 132.

Please still refer to FIG. 1. After forming the CESL 140 and the ILD layer 142, a planarization process is performed to remove a portion of the ILD layer 142 and a portion of the CESL 140 to expose the dummy gates of the first semiconductor device 110 and the second semiconductor device 112. Then, a suitable etching process is performed to remove the dummy gates of the first semiconductor device 110 and the second semiconductor device 112, and thus a first gate trench 150 and a second gate trench 152 are simultaneously formed in the first semiconductor device 110 and the second semiconductor device 112, respectively. The dielectric layers or the substrate 100 are respectively exposed in bottoms of the first gate trench 150 and the second gate trench 152.

Next, a high-k gate dielectric layer 104, a bottom barrier layer 106a, and an etch stop layer 106b are sequentially formed on the substrate 100. It is noteworthy that the preferred embodiment is integrated with the high-k last process; therefore the abovementioned dielectric layers serve as an interfacial layer, and the high-k gate dielectric layer 104 can include high-k material such as rare earth metal oxide. The high-k gate dielectric layer 104 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). The bottom barrier layer 106a can include titanium nitride (TiN) and the etch stop layer 106b can include tantalum nitride (TaN), but not limited to this. In the preferred embodiment, the bottom barrier layer 106a and the etch stop layer 106b are taken as a multiple metal layer 106 which renders no influence to the work function of the subsequently formed metal gates.

Please still refer to FIG. 1. After forming the etch stop layer 106b, a chemical vapor deposition (CVD), a physical vapor deposition (PVD), or an atomic layer deposition (ALD) is performed to form a first work function metal layer 160 in the first gate trench 150 and the second gate trench 152. The first work function metal layer 160 is a p-type work function metal layer and exemplarily includes TiN, TaN, titanium carbide (TiC), tantalum carbide (TaC), tungsten carbide (WC), or aluminum titanium nitride (TiAlN), but not limited to this. In addition, the first work function metal layer 160 can be a single-layered structure or a multi-layered structure. After forming the first work function metal layer 160, a patterned mask 170, for example but not limited to a patterned photoresist, is formed on the substrate 100. The patterned mask 170 covers the first semiconductor device 110 but exposes the second semiconductor device 112, particularly exposes the first work function metal layer 160 in the second gate trench 152.

Figure 2:
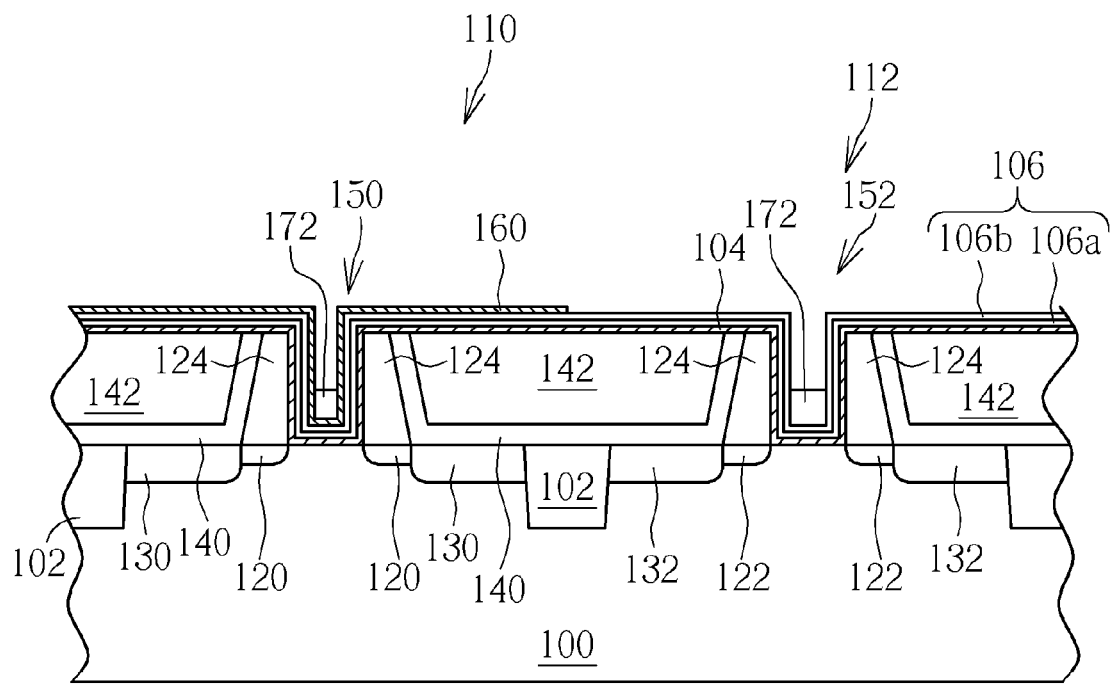

Please refer to FIG. 2. Then, a suitable etchant is used to remove the exposed first work function metal layer 160 from the second gate trench 152. And thus the etch stop layer 106b is exposed in the second gate trench 152. During removing the first work function metal layer 160, the etch stop layer 106b renders protection to the underneath bottom barrier layer 106a, the high-k gate dielectric layer 104 and the ILD layer 142. After etching the exposed first work function metal layer 160, the first work function metal layer 160 remains only in the first gate trench 150 and the first semiconductor device 110 while the multiple metal layer 106 is exposed in the second gate trench 152 as shown in FIG. 2.

Please still refer to FIG. 2. Next, the patterned mask 170 is removed and followed by performing a first pull back step. According to the preferred embodiment, the first pull back step first forms a patterned mask 172 respectively in the first gate trench 150 and the second gate trench 152. The patterned mask 172 includes materials having superior gap-filling ability, such as photoresist materials formed by spin coating, a dielectric anti-reflection coating (DARC), a light absorbing oxide (DUO), a bottom anti-reflective coating (BARC), or a sacrificial light absorbing material (SLAM), but not limited to this. It is noteworthy that a surface of the patterned mask 172 is lower than openings of the first gate trench 150 and the second gate trench 152 as shown in FIG. 2. Accordingly, the first work function metal layer 160 at the opening of the first gate trench 150 and the multiple metal layer 106 at the opening of the second gate trench 152 are both exposed.

Figure 3:
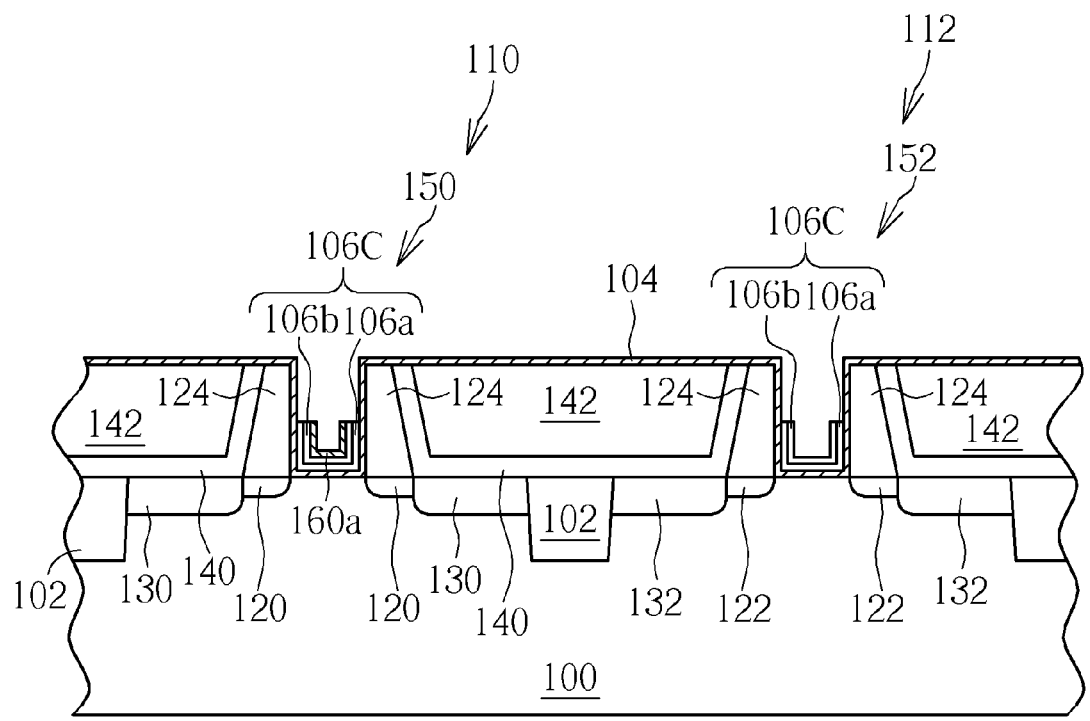

Please refer to FIG. 3. Next, the first pull back step performs an etching process to simultaneously remove the exposed the first work function metal layer 160 and the exposed multiple metal layer 106 from the first gate trench 150. The etching process simultaneously removes the exposed the multiple metal layer 106 from the second gate trench 152. Thus, a U-shaped first work function metal layer 160a and a U-shaped multiple metal layer 106c are formed in the first gate trench 150 after the first pull back step. Simultaneously, a U-shaped multiple metal layer 106c is formed in the second gate trench 152. It is noteworthy that topmost portions of the U-shaped first work function metal layer 160a in the first gate trench 150 and topmost portions of the U-shaped multiple metal layer 106c in both of the first gate trench 150 and the second gate trench 152 are all lower than the openings of the first gate trench 150 and the second gate trench 152 as shown in FIG. 3. Furthermore, the topmost portions of the U-shaped first work function metal layer 160a in the first gate trench 150 and the topmost portions of the U-shaped multiple metal layer 106c in both of the first gate trench 150 and the second gate trench 152 are all coplanar. In other words, the high-k gate dielectric layer 104 is exposed on the substrate 100, particularly exposed on the ILD layer 142 after performing the first pullback step. As shown in FIG. 3, the high-k gate dielectric layer 104 is exposed at the openings of the first gate trench 150 and the second gate trench 152.

Figure 4:
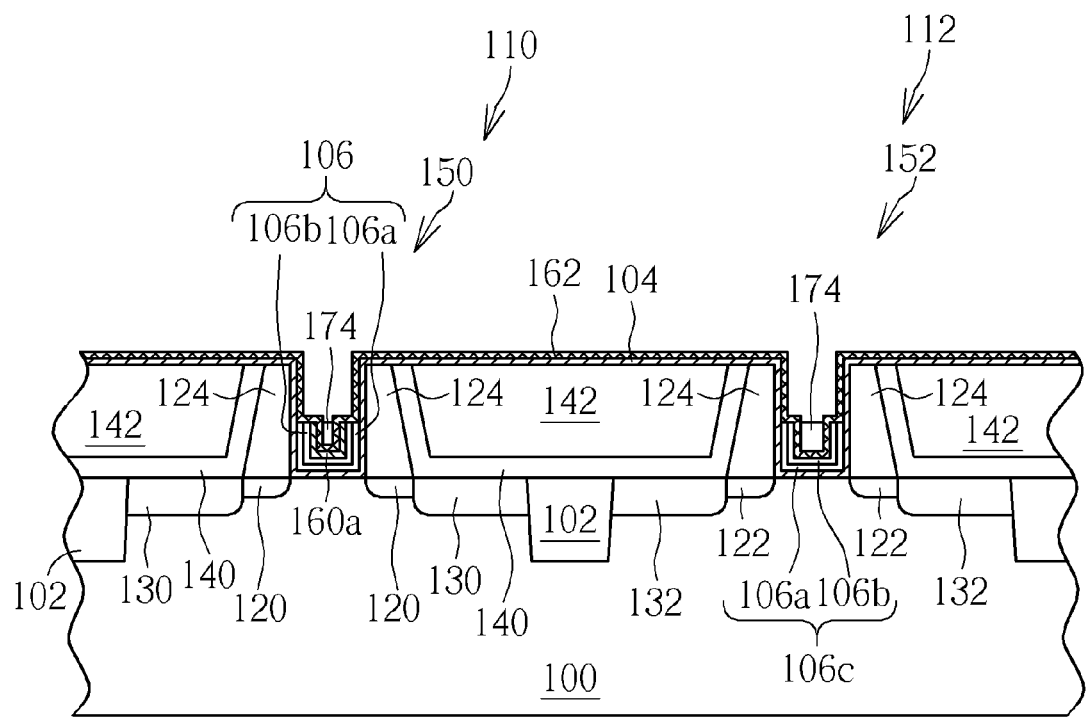

Please refer to FIG. 4. After performing the first pull back step, the patterned mask 172 is removed and followed by performing a CVD process or a PVD process to form a second work function metal layer 162 on the substrate 100. The second work function metal layer 162 includes an n-type work function metal layer such as titanium aluminide (TiAl), zirconium aluminide (ZrAl), tungsten aluminide (WAl), tantalum aluminide (TaAl), or hafnium aluminide (HfAl), but not limited to this. Additionally, the second work function metal layer 162 can be a single-layered structure or a multi-layered structure.

Please still refer to FIG. 4. Subsequently, a second pull back step is performed. According to the preferred embodiment, the second pull back step first provides a patterned mask layer 174, for example but not limited to a patterned photoresist layer, formed on the second work function metal layer 162. It is noteworthy that, a surface of the patterned mask 174 is lower than the openings of the first gate trench 150 and the second gate trench 152. The patterned mask 174 can include materials having superior gap-filling ability as mentioned above.

Figure 5:
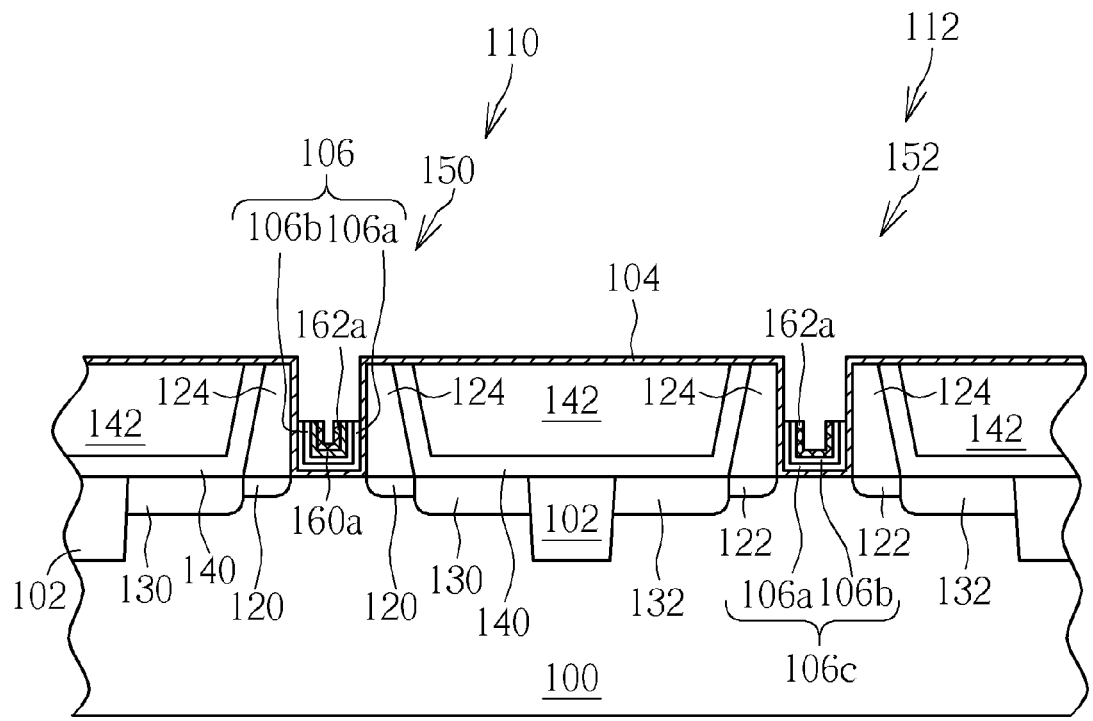

Please refer to FIG. 4 and FIG. 5. Next, the second pull back step performs an etching process to remove the exposed second work function metal layer 162 from the first gate trench 150 and the second gate trench 152 simultaneously. Accordingly, a U-shaped second work function metal layer 162a is respectively formed in the first gate trench 150 and the second gate trench 152 after performing the second pull back step. It is noteworthy that topmost portions of the U-shaped second work function metal layer 162a is lower than the openings of the first gate trench 150 and the second gate trench 152 as shown in FIG. 5. Furthermore, the topmost portions of the U-shaped second work function metal layer 162a, the topmost portions of the U-shaped first work function metal layer 160a, and the topmost portions of the U-shaped multiple metal layer 106c are all coplanar. In other words, the high-k gate dielectric layer 104 is exposed on the substrate 100, particularly exposed on the ILD layer 142, again after performing the second pull back step. Furthermore, the high-k dielectric layer 104 is exposed at the openings of the first gate trench 150 and the second gate trench 152 as shown in FIG. 5.

Figure 6:
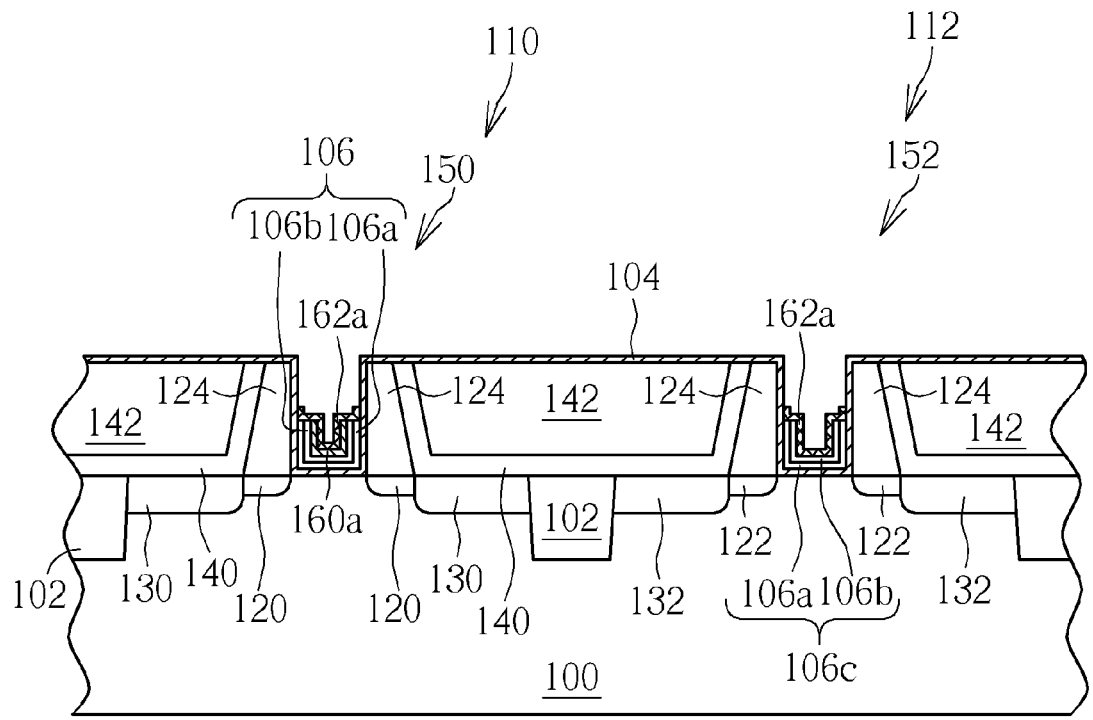

Additionally, positions of the topmost portions of the U-shaped second work function metal layer 162a can be modified by adjusting thickness of the patterned mask 174 in the first gate trench 150 and the second gate trench 152. For example, though the topmost portions of the U-shaped second work function metal layer 162a, the topmost portions of the U-shaped first work function metal layer 160a, and the topmost portions of the U-shaped multiple metal layer 106c are all coplanar in the preferred embodiment, the topmost portions of the U-shaped second work function metal layer 162a can be non-coplanar with the topmost portions of the U-shaped first work function metal layer 160a and the topmost portions of the U-shaped multiple metal layer 106c according to a modification to the preferred embodiment. For example, the topmost portions of the U-shaped second work function metal layer 162a can cover the topmost portions of the U-shaped first work function metal layer 160a and the topmost portions of the U-shaped multiple metal layer 106c as shown in FIG. 6.

Figure 7:
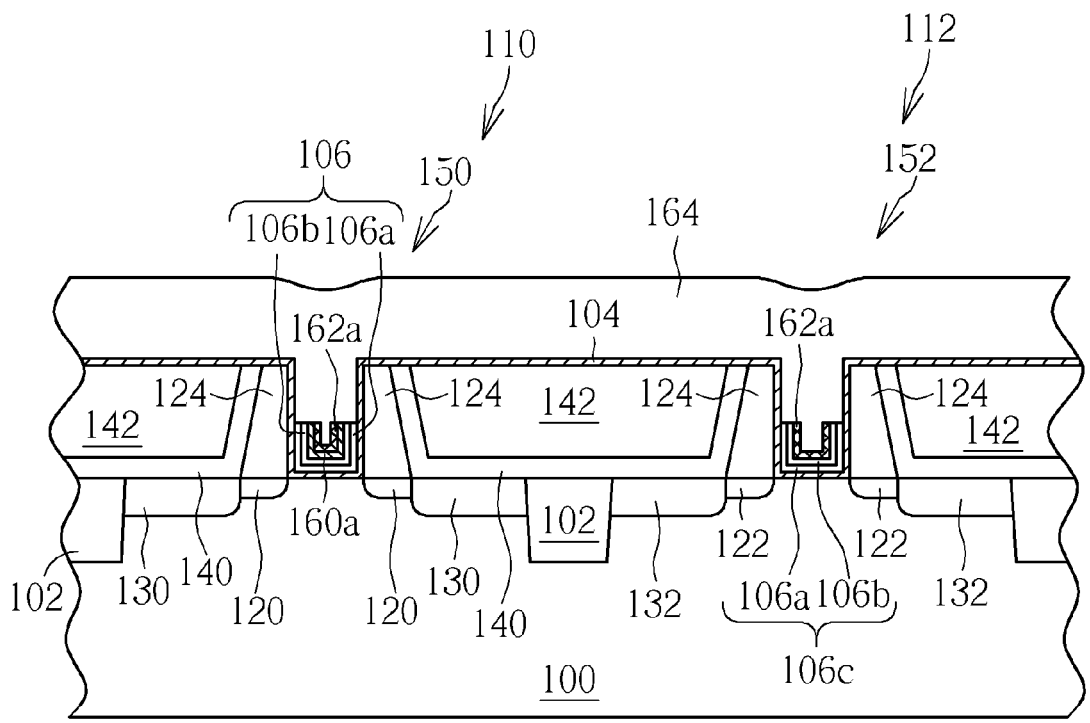

Please refer to FIG. 7. Thereafter, a filling metal layer 164 is formed in both of the first gate trench 150 and the second gate trench 152. Additionally, a top barrier layer (not shown) is preferably formed between the U-shaped second work function metal layer 162a and the filling metal layer 164. The top barrier layer can include TiN, but not limited to this. The filling metal layer 164 is formed to fill up the first gate trench 150 and the second gate trench 152. The filling metal layer 164 includes materials with low resistance and superior gap-filling characteristic, such as Al, TiAl, or titanium aluminum oxide (TiAlO), but not limited to this.

Subsequently, a planarization process, such as a chemical mechanical polishing (CMP) process is performed to remove the unnecessary filling metal layer 164 and even the high-k gate dielectric layer 104 exposed on the ILD layer 142. Consequently, a first metal gate and a second metal gate are obtained. In addition, the ILD layer 140 and the CESL 142 can be selectively removed and sequentially reformed on the substrate 100 for improving performance of the semiconductor devices 110/112 in the preferred embodiment. Since the abovementioned CMP process is well-known to those skilled in the art, those details are omitted in the interest of brevity.

According to the manufacturing method for semiconductor device having metal gate provided by the preferred embodiment, the first pull back step is performed to remove the portions of the first work function metal layer 160 from the first gate trench 150 and the portions of the multiple metal layer 106 from the second gate trench 152 after forming the first work function metal layer 160, particularly after removing the first work function metal layer 160 from the second gate trench 152. Therefore, the high-k gate dielectric layer 104 is exposed at the openings of the first gate trench 150 and the second gate trench 152 and wider openings are obtained regardless of the thicknesses of the multiple metal layer 106 and the first work function metal layer 160. Consequently, filling result of the subsequently formed second work function metal layer 162 is improved. In the same concept, the second pull back step is performed to remove the portions of the second work function metal layer 162 from the first gate trench 150 and the second gate trench 152 after forming the second work function metal layer 162, therefore wider openings are obtained regardless of the thickness of the second work function metal layer 162. And thus the filling metal layer 164 can be successfully formed to fill up the first gate trench 150 and the second gate trench 152 without any seam. Therefore, reliability of the first semiconductor device 110 and the second semiconductor device 112 is improved.

Figure 8:
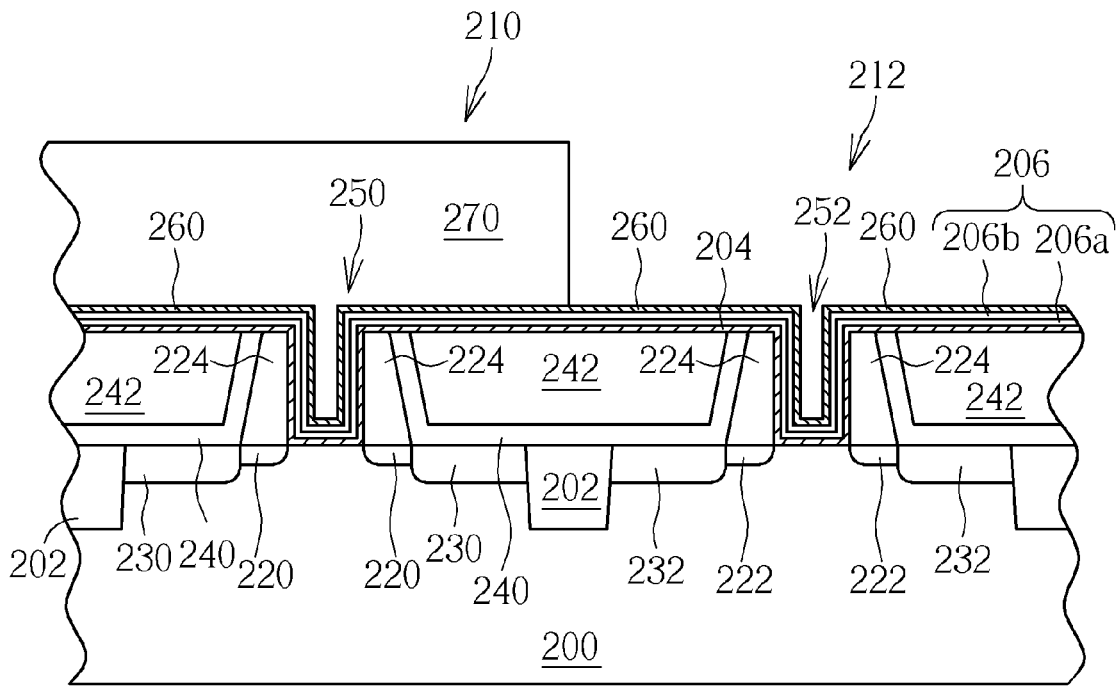

Please refer to FIGS. 8-13, which are drawings illustrating a manufacturing method for semiconductor device having metal gate provided by a second preferred embodiment of the present invention. Please note that elements the same in both first and second preferred embodiments can include the same material, and thus those details are omitted in the interest of brevity. As shown in FIG. 8, the preferred embodiment first provides a substrate 200. The substrate 200 includes a first semiconductor device 210 and a second semiconductor device 212 formed thereon. And a STI 202 is formed in the substrate 200 between the first semiconductor device 210 and the second semiconductor device 212 for providing electrical isolation. In the preferred embodiment, the first semiconductor device 210 includes a p-type semiconductor device and the second semiconductor device 212 includes an n-type semiconductor device.

Please refer to FIG. 8 again. The first semiconductor device 210 and the second semiconductor device 212 respectively includes a dielectric layer (not shown) and a dummy gate (not shown). Furthermore, the first semiconductor device 210 and the second semiconductor device 212 respectively include first LDDs 220 and second LDDs 222, a spacer 224, a first source/drain 230 and a second source/drain 232. Additionally, salicides (not shown) are respectively formed on the first source/drain 230 and the second source/drain 232. After forming the first semiconductor device 210 and the second semiconductor device 212, a CESL 240 and an ILD layer 242 are sequentially formed.

Please still refer to FIG. 8. After forming the CESL 240 and the ILD layer 242, a planarization process is performed to remove a portion of the ILD layer 242 and a portion of the CESL 242, and a suitable etching process is subsequently performed to remove the dummy gates of the first semiconductor device 210 and the second semiconductor device 212. Thus a first gate trench 250 and a second gate trench 252 are simultaneously formed in the first semiconductor device 210 and the second semiconductor device 212, respectively. The dielectric layers or the substrate 200 are respectively exposed in bottoms of the first gate trench 250 and the second gate trench 252.

Next, a high-k dielectric layer 204, a bottom barrier layer 206a, and an etch stop layer 206b are sequentially formed on the substrate 200 as shown in FIG. 8. It is noteworthy that the preferred embodiment is also integrated with the high-k last process; therefore the abovementioned dielectric layers serve as an interfacial layer. As mentioned above, the bottom barrier layer 206a and the etch stop layer 206b are taken as a multiple metal layer 206 which renders no influence to the work function of the subsequently formed metal gates.

Please still refer to FIG. 8. After forming the etch stop layer 206b, a CVD, a PVD, or an ALD is performed to form a first work function metal layer 260 in the first gate trench 250 and the second gate trench 252. The first work function metal layer 260 is a p-type work function metal layer. In addition, the first work function metal layer 260 can be a single-layered structure or a multi-layered structure. After forming the first work function metal layer 260, a patterned mask 270, for example but not limited to a patterned photoresist, is formed on the substrate 200. The patterned mask 270 covers the first semiconductor device 210 but exposes the second semiconductor device 212, particularly exposes the first work function metal layer 260 in the second gate trench 252.

Figure 9:
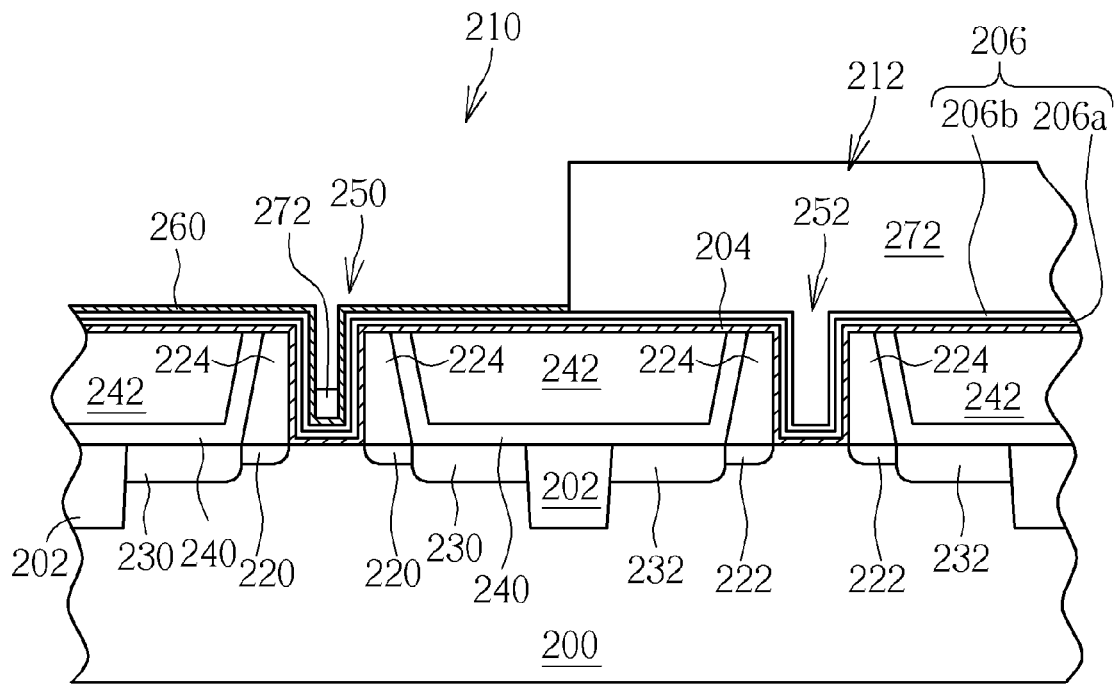

Please refer to FIG. 9. Then, a suitable etchant is used to remove the exposed first work function metal layer 260 from the second gate trench 252. And thus the etch stop layer 206b is exposed in the second gate trench 252. During removing the first work function metal layer 260, the etch stop layer 206b renders protection to the underneath bottom barrier layer 206a, the high-k gate dielectric layer 204 and the ILD layer 242. After etching the exposed first work function metal layer 260, the first work function metal layer 260 remains only in the first gate trench 250 and the first semiconductor device 210 while the multiple metal layer 206 is exposed in the second gate trench 252 as shown in FIG. 9.

Please still refer to FIG. 9. Next, the patterned mask 270 is removed and followed by performing a first pull back step. According to the preferred embodiment, the first pull back step first forms a patterned mask 272 on the substrate 200. The patterned mask 272 includes materials having superior gap-filling ability. It is noteworthy that the patterned mask 272 covers the entire the second semiconductor device 212, and particularly fills up the second gate trench 252 while a surface of the patterned mask 272 is lower than an opening of the first gate trench 250 as shown in FIG. 9. Accordingly, the first work function metal layer 260 at the opening of the first gate trench 250 is exposed.

Figure 10:
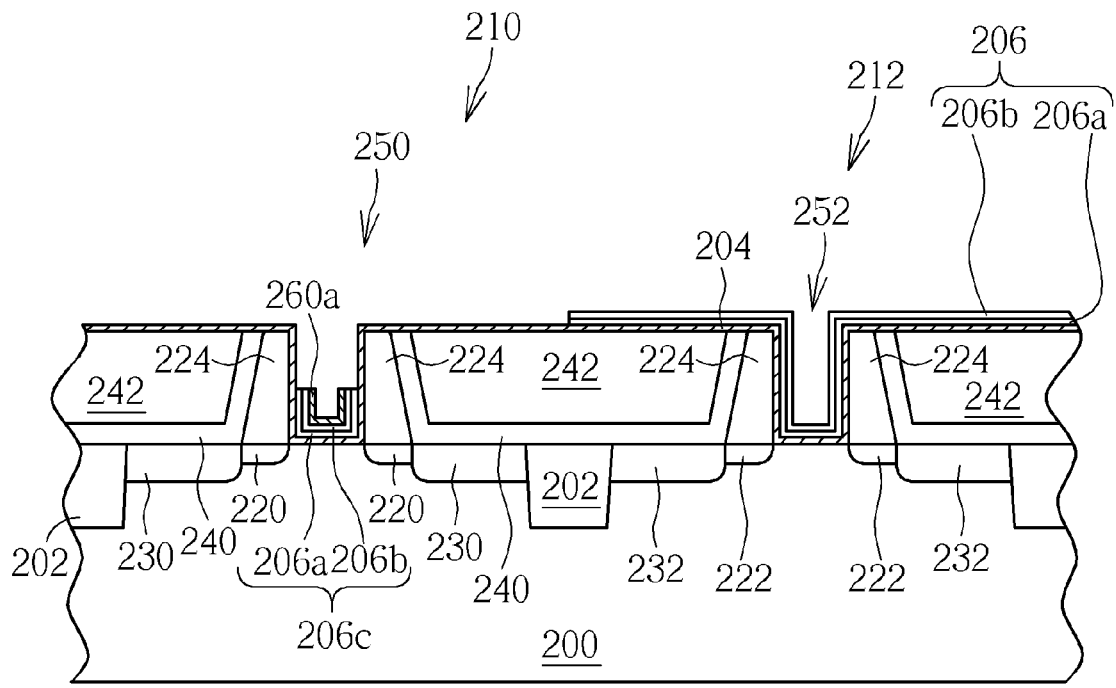

Please refer to FIG. 9 and FIG. 10. Next, the first pull back step performs an etching process to remove the exposed first work function metal layer 260 and the exposed multiple metal layer 206 from the first gate trench 250. Thus, a U-shaped first work function metal layer 260a and a U-shaped multiple metal layer 206c are formed in the first gate trench 250 after the first pull back step as shown in FIG. 10. The multiple metal layer 206 in the second gate trench 252 is protected by the patterned mask 272 and therefore is impervious to the etching process of the first pullback step. It is noteworthy that topmost portions of the U-shaped first work function metal layer 260a and topmost portions of the U-shaped multiple metal layer 206c in the first gate trench 250 are all lower than the openings of the first gate trench 250 as shown in FIG. 10. Furthermore, the topmost portions of the U-shaped first work function metal layer 260a and the topmost portions of the U-shaped multiple metal layer 206c in the first gate trench 250 are coplanar. In other words, the high-k gate dielectric layer 204 is exposed at the opening of the first gate trench 250.

Figure 11:
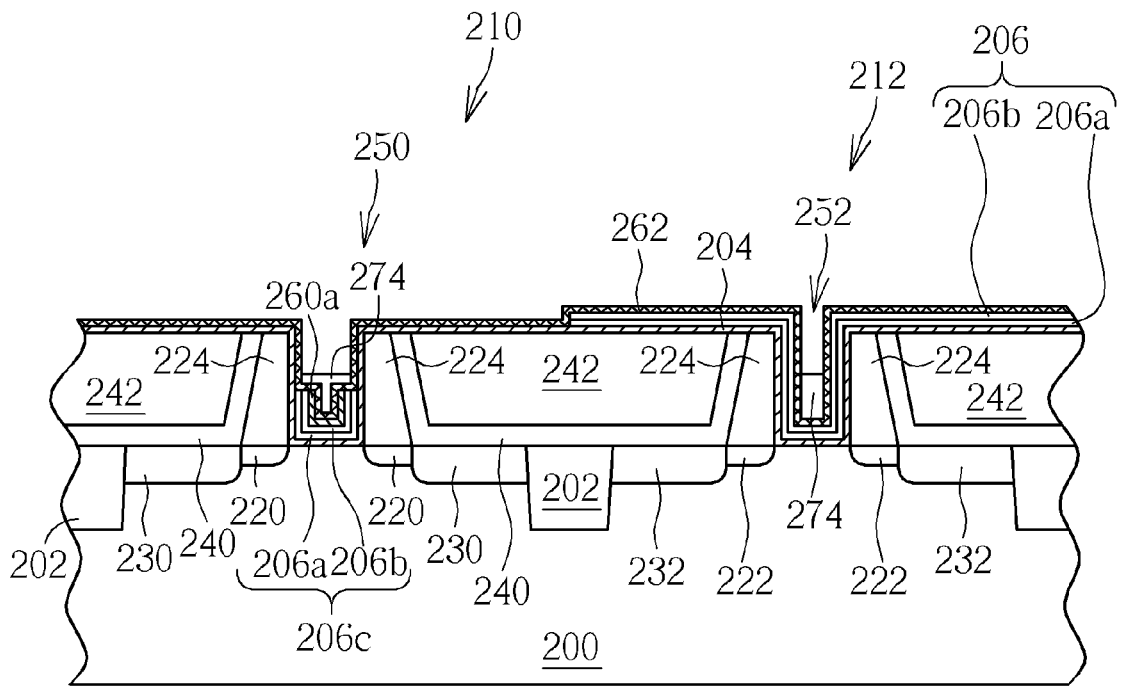

Please refer to FIG. 11. After performing the first pull back step, the patterned mask 272 is removed and followed by performing a CVD process or a PVD process to form a second work function metal layer 262 on the substrate 200. The second work function metal layer 262 includes an n-type work function metal layer and can be a single-layered structure or a multi-layered structure.

Please still refer to FIG. 11. Subsequently, a second pull back step is performed. According to the preferred embodiment, the second pull back step first provides a patterned mask layer 274, for example but not limited to a patterned photoresist layer, formed on the second work function metal layer 262. It is noteworthy that a surface of the patterned mask 274 is lower than the openings of the first gate trench 250 and the second gate trench 252. The patterned mask 274 can include materials having superior gap-filling ability as mentioned above.

Figure 12:
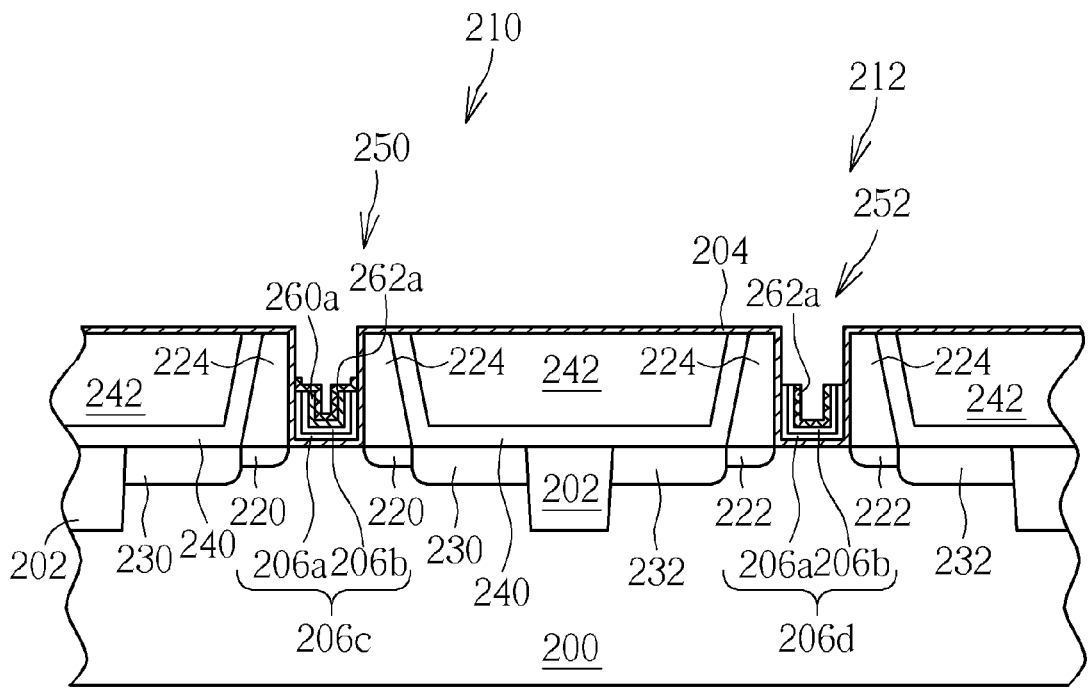

Please refer to FIG. 11 and FIG. 12. Next, the second pull back step performs an etching process to remove the exposed second work function metal layer 262 from the first gate trench 250 and the second gate trench 252 simultaneously. Accordingly, a U-shaped second work function metal layer 262a is respectively formed in the first gate trench 250 and the second gate trench 252 after performing the second pull back step. Furthermore, a U-shaped multiple metal layer 206d is simultaneously formed in the second gate trench 252. It is noteworthy that topmost portions of the U-shaped second work function metal layer 262a and topmost portions of the U-shaped multiple metal layer 206d are lower than the openings of the first gate trench 250 and the second gate trench 252 as shown in FIG. 11. Furthermore, the topmost portions of the U-shaped second work function metal layer 262a and the topmost portions of the U-shaped multiple metal layer 206d are non-coplanar with the topmost portions of the U-shaped first work function metal layer 260a and the topmost portions of the U-shaped multiple metal layer 206c. As shown in FIG.

12, the topmost portions of the U-shaped second work function metal layer 262a and the topmost portions the U-shaped multiple metal layer 206d in the second gate trench 252 are higher than the topmost portions of the U-shaped first work function metal layer 260a and the topmost portions of the U-shaped multiple metal layer 206c in the first gate trench 250 as shown in FIG. 12. Furthermore, the U-shaped second work function metal layer 262a in the first gate trench 250 covers the U-shaped first work function metal layer 260a and the U-shaped multiple metal layer 206c. After the second pull back step, the high-k gate dielectric layer 204 is exposed on the substrate 200, particularly exposed on the ILD layer 242, again. Furthermore, the high-k dielectric layer 204 is exposed at the openings of the first gate trench 250 and the second gate trench 252 as shown in FIG. 12.

Additionally, positions of the topmost portions of the U-shaped second work function metal layer 262a can be modified by adjusting thickness of the patterned mask 274 in the first gate trench 250 and the second gate trench 252. For example, though the topmost portions of the U-shaped second work function metal layer 262a and the topmost portions of the U-shaped multiple metal layer 206d are non-coplanar with the topmost portions of the U-shaped first work function metal layer 260a and the topmost portions of the U-shaped multiple metal layer 206c in the preferred embodiment, the topmost portions of the U-shaped second work function metal layer 262a and the topmost portions of the U-shaped multiple metal layer 206d can be coplanar with the topmost portions of the U-shaped first work function metal layer 260a and the topmost portions of the U-shaped multiple metal layer 206c according to a modification to the preferred embodiment.

Figure 13:
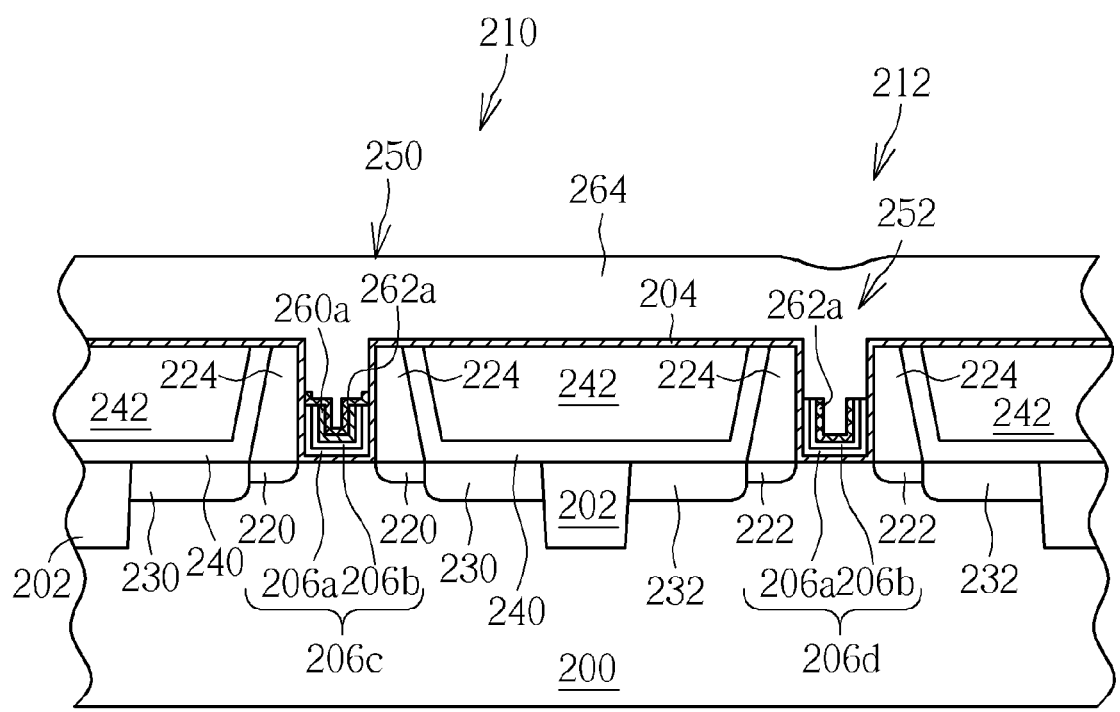

Please refer to FIG. 13. Thereafter, a filling metal layer 264 is formed in both of the first gate trench 250 and the second gate trench 252. Additionally, a top barrier layer (not shown) is preferably formed between the U-shaped second work function metal layer 262a and the filling metal layer 264. Subsequently, a planarization process, such as a CMP process is performed to remove the unnecessary filling metal layer 264 and even the high-k gate dielectric layer 204 exposed on the ILD layer 242. Consequently, a first metal gate and a second metal gate are obtained.

According to the manufacturing method for semiconductor device having metal gate provided by the preferred embodiment, the first pull back step is performed to remove the portions of the first work function metal layer 260 and the portions of the multiple metal layer 206 only from the first gate trench 250 after forming the first work function metal layer 260, particularly after removing the first work function metal layer 260 from the second gate trench 252. Therefore, the high-k gate dielectric layer 204 is exposed at the opening of the first gate trench 250 and a wider opening is obtained regardless of the thickness of the multiple metal layer 206 and the first work function metal layer 260. Consequently, filling result of the subsequently formed second work function metal layer 262 is improved. In the same concept, the second pull back step is performed to remove the portions of the second work function metal layer 262 from the first gate trench 250 and the second gate trench 252 after forming the second work function metal layer 262, therefore wider openings are obtained regardless of the thickness of the second work function metal layer 262. And thus the filling metal layer 264 can be successfully formed to fill up the first gate trench 250 and the second gate trench 252 without any seam. Therefore, reliability of the first semiconductor device 210 and the second semiconductor device 212 is improved.

According to the manufacturing method for semiconductor device having metal gate provided by the present invention, the first pull back step is performed to remove portions of the first work function metal layer from the first gate trench, preferably from both of the first gate trench and the second gate trench, after forming the first work function metal layer in the first gate trench. Consequently, a wider opening of the first gate trench is at least obtained. And thus trench-filling results of the following formed layers, such as the second work function metal layer, are improved. In the same concept, the second pull back step is performed to remove the portions of the second work function metal layer from the first gate trench and the second gate trench after forming the second work function metal layer. Accordingly, the first work function metal layer and the second work function metal layer obtain a U shape. More important, topmost portions of the U-shaped first work function metal layer and the U-shaped second work function metal layer are all lower than the openings of the gate trenches. Thus the subsequently formed material, such as the filling metal layer, is successfully formed in all gate trenches and seams are avoided. Accordingly, the manufacturing method for semiconductor device having metal gate provided by the present invention avoids the seam and the adverse impact rendered from the seams, and thus has the advantage of improved reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for semiconductor device having metal gate, comprising steps of:
    providing a substrate having a first semiconductor device and a second semiconductor device formed thereon, the first semiconductor device having a first gate trench and the second semiconductor device having a second gate trench;
    sequentially forming a high dielectric constant (high-k) gate dielectric layer and a multiple metal layer on the substrate;
    forming a first work function metal layer in the first gate trench and the multiple metal layer being exposed in the second gate trench;
    performing a first pull back step to remove a portion of the first work function metal layer from the first gate trench;
    forming a second work function metal layer in the first gate trench and the second gate trench after performing the first pull back step; and
    performing a second pull back step to remove a portion of the second work function metal layer from the first gate trench and the second gate trench after forming the second work function metal layer.

2. The manufacturing method for semiconductor device having metal gate according to claim 1, wherein the first semiconductor device comprises a first conductivity type and the second semiconductor device comprises a second conductivity type, and the first conductivity type and the second conductivity type are complementary.

3. The manufacturing method for semiconductor device having metal gate according to claim 1, wherein the multiple metal layer comprises at least a bottom barrier layer and an etch stop layer.

4. The manufacturing method for semiconductor device having metal gate according to claim 1, wherein the step of forming the first work function metal layer in the first gate trench further comprises:
    forming the first work function metal layer on the substrate;

forming a first patterned mask on the substrate, the first patterned mask exposing at least a portion of the first work function metal layer in the second gate trench; and removing the first work function metal layer exposed by the first patterned mask.

5. The manufacturing method for semiconductor device having metal gate according to claim 1, wherein the first pull back step further comprises:

forming a second patterned mask respectively in the first gate trench and the second gate trench, a surface of the second patterned mask being lower than openings of the first gate trench and the second gate trench; and removing the first work function metal layer exposed by the second patterned mask from the first gate trench and the multiple metal layer exposed by the second patterned mask from the second gate trench simultaneously.

6. The manufacturing method for semiconductor device having metal gate according to claim 5, wherein a U-shaped first work function metal layer is formed in the first gate trench and a U-shaped multiple metal layer is formed in the second gate trench after performing the first pull back step.

7. The manufacturing method for semiconductor device having metal gate according to claim 6, wherein topmost portions of the U-shaped first work function metal layer and topmost portions of the U-shaped multiple metal layer are lower than the openings of the first gate trench and the second gate trench.

8. The manufacturing method for semiconductor device having metal gate according to claim 7, wherein the high-k gate dielectric layer is exposed on the substrate, at the opening of the first gate trench, and at the opening of the second gate trench after performing the first pull back step.

9. The manufacturing method for semiconductor device having metal gate according to claim 1, wherein the first pull back step further comprises:

forming a second patterned mask filling up the second gate trench on the substrate, a surface of the second patterned mask being lower than an opening of the first gate trench; and removing the first work function metal layer exposed by the second patterned mask from the first gate trench.

10. The manufacturing method for semiconductor device having metal gate according to claim 9, wherein the multiple metal layer in the second gate trench is protected by the second patterned mask.

11. The manufacturing method for semiconductor device having metal gate according to claim 9, wherein a U-shaped first work function metal layer is formed in the first gate trench after performing the first pull back step.

12. The manufacturing method for semiconductor device having metal gate according to claim 11, wherein topmost portions of the U-shaped first work function metal layer are lower than the opening of the first gate trench.

13. The manufacturing method for semiconductor device having metal gate according to claim 12, wherein the high-k gate dielectric layer is exposed at the opening of the first gate trench after performing the first pull back step.

14. The manufacturing method for semiconductor device having metal gate according to claim 1, wherein the second pull back step further comprises:

forming a third patterned mask in the first gate trench and the second gate trench, a surface of the third patterned mask being lower than openings of the first gate trench and second gate trench; and removing the second work function metal layer exposed by the third patterned mask from the first gate trench and the second gate trench simultaneously.

15. The manufacturing method for semiconductor device having metal gate according to claim 14, wherein a U-shaped second work function metal layer is formed in the first gate trench and the second gate trench after performing the second pull back step.

16. The manufacturing method for semiconductor device having metal gate according to claim 15, wherein topmost portions of the U-shaped second work function metal layer are lower than the openings of the first gate trench and the second gate trench.

17. The manufacturing method for semiconductor device having metal gate according to claim 1, wherein topmost portions of the second work function metal layer, topmost portions of the first work function metal layer, and topmost portions of the multiple metal layer are coplanar after performing the second pull back step.

18. The manufacturing method for semiconductor device having metal gate according to claim 1, wherein topmost portions of the second work function metal layer and topmost portions of the first work function metal layer are non-coplanar after performing the second pull back step.

19. The manufacturing method for semiconductor device having metal gate according to claim 18, wherein the topmost portions of the first work function metal layer in the first gate trench and topmost portions of the multiple metal layer in the first gate trench are coplanar, and the topmost portions of the second work function metal layer in the second gate trench and topmost portions of the multiple metal layer in the second gate trench are coplanar.

20. The manufacturing method for semiconductor device having metal gate according to claim 1, further comprising forming a filling metal layer respectively in the first gate trench and the second gate trench after performing the second pull back step.

* * * * *